United States Patent [19]

Frentz et al.

[11] Patent Number: 5,087,877
[45] Date of Patent: Feb. 11, 1992

[54] TEST CONTACT FIXTURE USING FLEXIBLE CIRCUIT TAPE

[75] Inventors: Dieter Frentz, Phoenix; Gregory L. Westbrook, Chandler; William M. Williams, Gilbert, all of Ariz.

[73] Assignee: Motorola Inc., Schaumburg, Ill.

[21] Appl. No.: 659,644

[22] Filed: Feb. 25, 1991

[51] Int. Cl.⁵ .................. G01R 1/02; G01R 1/067
[52] U.S. Cl. .................. 324/158 F; 324/72.5; 324/158 P
[58] Field of Search ............. 324/72.5, 158 P, 158 F

[56] References Cited

U.S. PATENT DOCUMENTS

| | | | |
|---|---|---|---|
| 3,715,662 | 2/1973 | Richelmann | 324/158 F |
| 3,848,221 | 11/1974 | Lee, Jr. | 324/158 F |
| 4,574,235 | 3/1986 | Kelly et al. | 324/158 F |
| 4,639,058 | 1/1987 | Morgan | 324/158 F |
| 4,835,464 | 5/1989 | Slye et al. | 324/158 P |
| 4,887,030 | 12/1989 | Niki et al. | 324/158 F |
| 4,964,808 | 10/1990 | Riechelmann | 324/158 P |
| 4,970,460 | 11/1990 | Jensen et al. | 324/158 P |

FOREIGN PATENT DOCUMENTS 0078076 4/1988 Japan .................. 324/158 F

Primary Examiner—Kenneth A. Wieder
Assistant Examiner—William J. Burns
Attorney, Agent, or Firm—Joe E. Barbee

[57] ABSTRACT

A test contact fixture which uses a flexible printed circuit tape to make contact to the integrated circuit and to a rigid printed circuit board which is part of the test equipment. The flexible printed circuit tape is held tightly against a hardened steel support allowing extremely accurate alignment both horizontally and vertically. The mounting plate provides a ground plane so that each lead may easily be configured as a 50 ohm transmission line. Leads of the integrated circuit under test are held in contact with the conductive lines on top of the flexible printed circuit tape by externally applied pressure allowing extremely rapid loading and unloading of the fixture. The body of the integrated circuit is held clear of the contact surfaces allowing heat control fixtures to be used to control the temperature of the integrated circuit during testing.

12 Claims, 3 Drawing Sheets

TEST CONTACT FIXTURE USING FLEXIBLE CIRCUIT TAPE

BACKGROUND OF THE INVENTION

The present invention relates, in general, to fixtures for testing of electrical devices such as integrated circuits, and more particularly to a fixture which uses flexible printed circuit tape to make contact with integrated circuits mounted in tape automated bonded (TAB) packages.

Tape automated bonding of integrated circuits has allowed a significant increase in the packaging density of high performance integrated circuits. This advance in packaging technology has placed severe demands on fixtures designed to facilitate testing of the integrated circuits. These fixtures must make reliable contact with every lead of the package, but must not require a lengthy setup and must not cause wear or damage to the package. With as many as 1024 leads per package and a need for minimal lead length the lead spacing must be extremely small. In the past, fixtures for testing integrated circuits have consisted of special sockets designed for the purpose. With the advent of surface mount technology and tape automated bonded integrated circuits a variety of these special sockets have been devised using compressible pins of some sort. These sockets have proven adequate for pins as close as a 0 508 mm pitch, but this pitch appears to be close to the practical limit to this approach. It is not practical to manufacture sockets of this type with a constant 50 ohm impedance, nor is the compressible pin alignment easy to adjust. Finally, the insertion and removal of integrated circuit parts requires several manual steps making such sockets unsuited to a high volume testing application.

High density packages now require a fixture which can handle leads having a 0.2032 mm pitch and a 0.1016 mm width. Leads this small and packed this closely require precise lateral and vertical alignment of both the integrated circuit leads and the test fixture contacts. In addition, high speed circuits such as application specific integrated circuits (ASIC) built using emitter coupled logic (ECL) can require a signal bandwidth of 3 Ghz. With signals of this bandwidth a constant impedance throughout the entire signal path, including the test contact fixture, is essential for proper operation of the integrated circuit being tested.

SUMMARY OF THE INVENTION

Briefly stated, the present invention provides a new kind of test contact fixture which uses a flexible printed circuit tape to make contact to the integrated circuit and to the underlying rigid printed circuit board. The flexible printed circuit tape can be produced with an extremely fine pitch and line width. The flexible printed circuit tape is held tightly against a hardened steel mounting plate allowing extremely accurate alignment horizontally and vertically. The rigid mounting plate provides a ground plane so that each lead may easily be configured as a 50 ohm transmission line. Leads of the integrated circuit under test are held in contact with the conductive lines on top of the flexible printed circuit tape by externally applied pressure allowing extremely rapid loading and unloading of the fixture. The body of the integrated circuit is held clear of the contact surfaces allowing heat control fixtures to be used to control the temperature of the integrated circuit during testing. While the invention directly addresses integrated circuit requirements, the present invention is equally useful for testing any electrical device which requires a high density of signal connections.

DETAILED DESCRIPTION OF THE DRAWINGS

Figure 1:
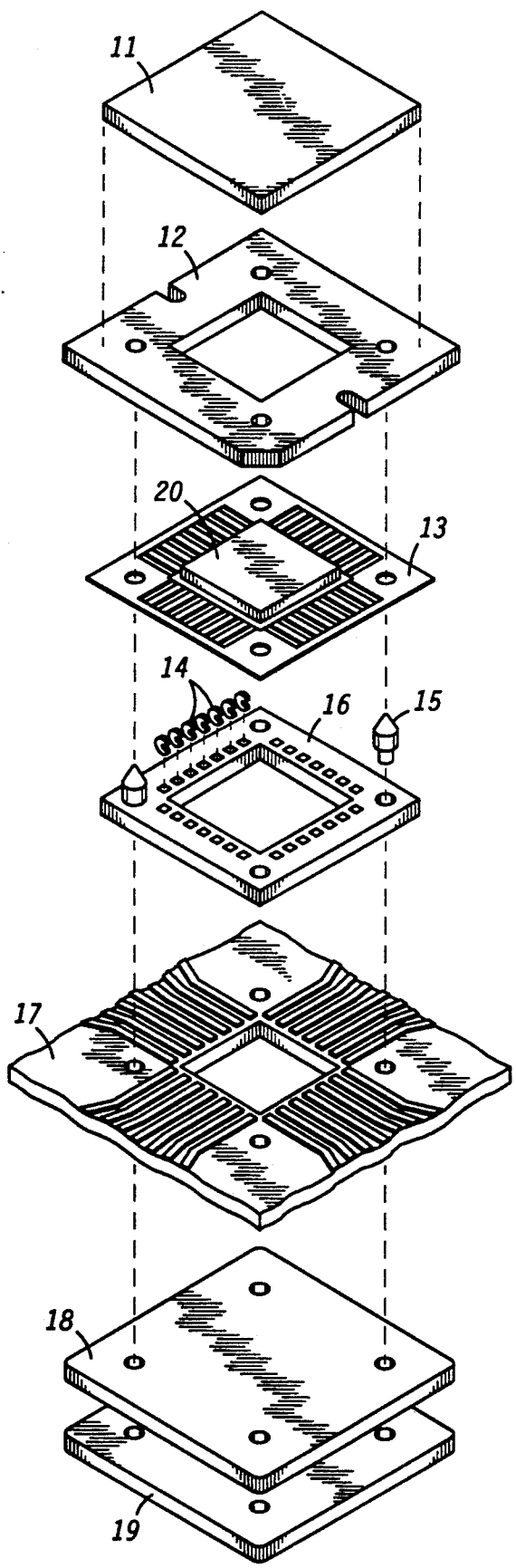
FIG. 1 depicts a high density test fixture typical of the prior art.

FIG. 1 depicts a high density test fixture typical of the prior art. A test fixture typical of the prior art is detailed in J. Lyman, "Tiny module compresses interconnection grid", Electronic Design, July 28, 1988, Copyright 1988, VNU Business Publications, Inc. This article depicts an "INTERPOSER test socket" which is manufactured and sold commercially by AMP Incorporated (INTERPOSER and AMP are trademarks of AMP Incorporated).

A support plate 19 is used to mount the components of the test fixture and to provide rigidity to the structure. Support plate 19 is electrically separated from a tester board 17 by an insulator 18. Tester board 17 is a printed circuit board which serves to electrically and mechanically connect the test contact fixture to a computer controlled automatic tester (not shown). An electrical device such as an integrated circuit 20 is mounted in a TAB leadframe 13. TAB leadframe 13 in turn is mounted in a protective carrier 12 which is used to protect integrated circuit 20 and TAB leadframe 13 from damage during manufacture, test, and shipment. Protective carrier 12 is held in place on the test fixture by a spring loaded top plate 11. An INTERPOSER socket 16 is placed between TAB leadframe 13 and tester board 17. Lateral alignment of protective carrier 12 and TAB leadframe 13 with INTERPOSER socket 16 is provided by a set of two locator pins 15. A plurality of INTERPOSER pins 14 protrude from the top and bottom of INTERPOSER socket 16 in such a way as to make electrical contact with the areas provided for this purpose on TAB leadframe 13 and tester board 17.

The "INTERPOSER test socket" can make contact to a TAB package having a lead pitch as small as 0.508 mm with a minimum width of 0.254 mm. Even so, higher density TAB packages now in use require a lead pitch of 0.2032 mm and lead width of 0.1016 mm, which is considerably smaller than the smallest such socket available. This socket system cannot easily be made to have a constant impedance signal transmission characteristic, so the maximum signal rate is below that required for high speed circuits. Clearly there is a need for a high density test contact fixture which can meet all of these requirements.

Figure 2:
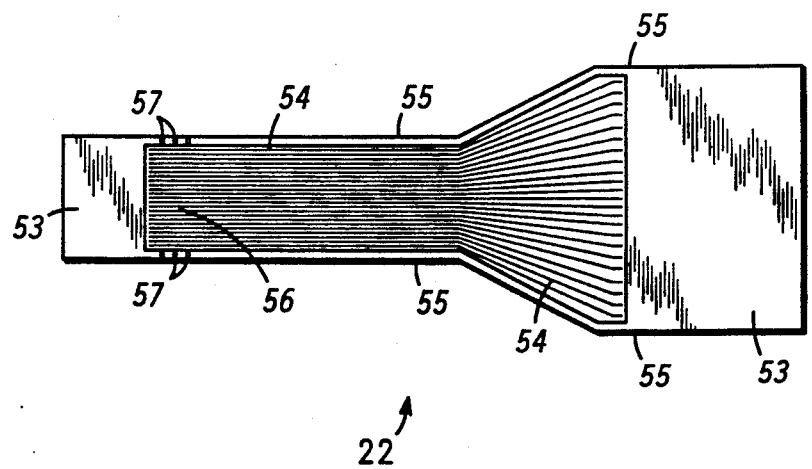
FIG. 2 depicts a flexible printed circuit tape which is used in conjunction with the present invention.
Figure 3:
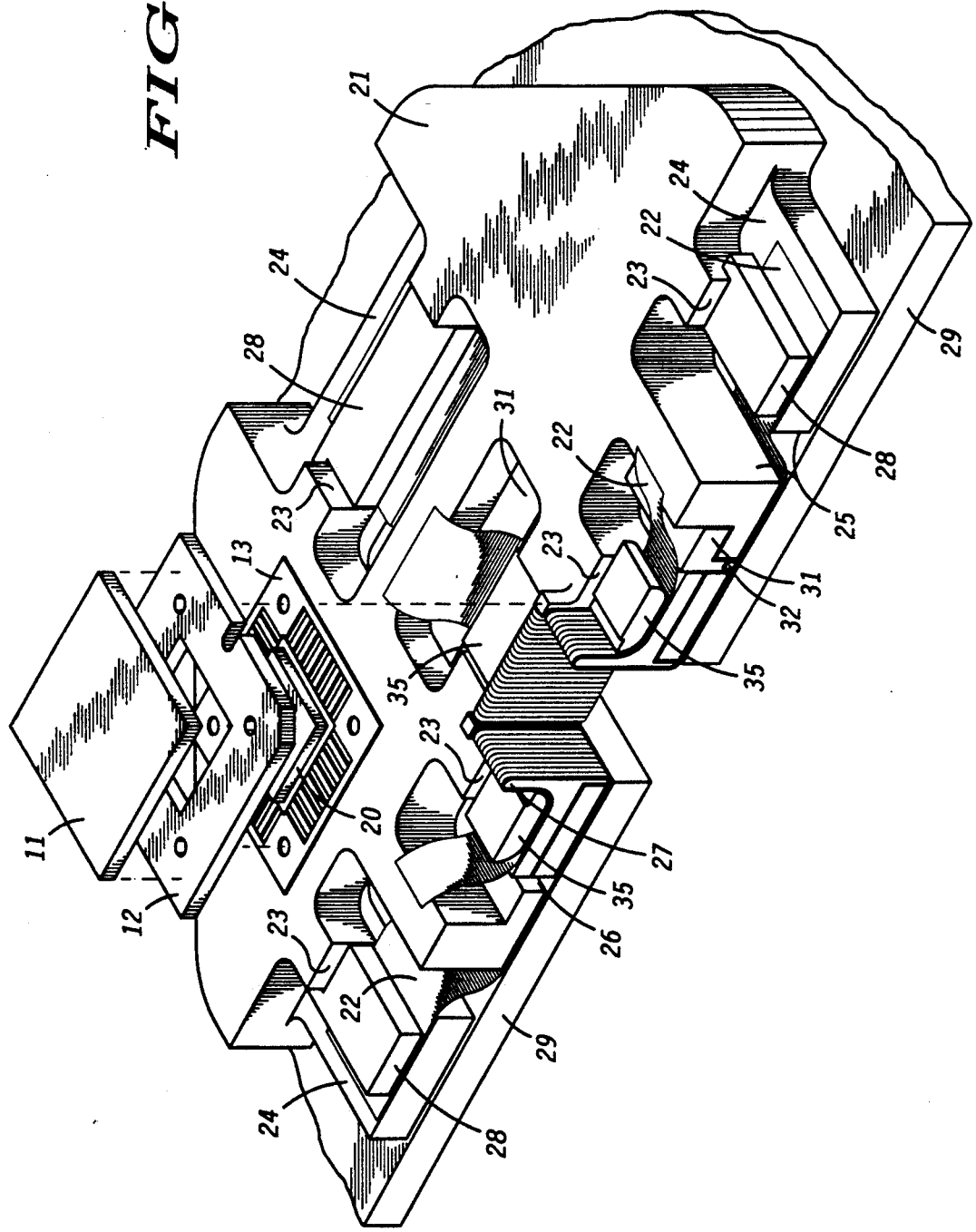
FIG. 3 depicts a cut-away view of a test contact fixture using flexible printed circuit tape according to the present invention.

FIG. 2 depicts a flexible printed circuit tape 22 which is used in conjunction with the present invention. Electrical contact is made using flexible printed circuit tape 22 rather than INTERPOSER pins 14 (FIG. 1). A plurality of electrically conductive patterns 54 are fabricated on flexible printed circuit tape 22 using high precision photographic techniques well known in the art. Flexible printed circuit tape 22 may easily be fabricated having a different number of electrically conductive patterns 54 to accommodate different lead counts for different applications without requiring modification of other components. The techniques used to fabricate flexible printed circuit tape 22 are similar to those used for TAB leadframe 13 (FIG. 1) which results in in similar minimum size constraints. Electrically conductive patterns 54 may be fabricated so as to allow tne contact fixture to be used with TAB leadframes 13 (FIG. 1) having a lead pitch and width far smaller than that possible using prior art. Two solid conductive areas 53 are fabricated at each end of flexible printed circuit tape 22 to provide a good electrical ground contact with a rigid mounting plate 21 (FIG. 3). A plurality of precision edges 55 serve to provide a highly accurate means to align flexible printed circuit tape 22 in a lateral direction while still allowing longitudinal movement. A contact area 56 comprises the small portion of flexible printed circuit tape 22 which actually touches the leads of TAB leadframe 13 (FIG. 1), and so is subject to wear and damage during use of the contact fixture. The preferred embodiment provides for this wear and damage by allowing flexible printed circuit tape 22 to be moved longitudinally a small amount thus providing fresh material for contact area 56 and extending the useful life of printed circuit tape 22. An alternate embodiment of flexible printed circuit tape 22 provides a plurality of precision alignment holes 57 which accurately position flexible printed circuit tape 22 in the vicinity of contact area 56 on the supporting structure by means of matching alignment pins. In another embodiment, alignment holes 57 are elongated into slots to allow flexible printed circuit tape 22 to be adjusted a small amount longitudinally to compensate for surface damage and wear at contact area 56. A small pitch between electrically conductive patterns 54 in the vicinity of contact area 56 results in a narrow overall width of flexible printed circuit tape 22. In the area of flexible printed circuit tape 22 where electrical contact is made to a tester board 29 (FIG. 3), the pitch between electrically conductive patterns 54 is much greater, resulting in a relatively wide portion of flexible printed circuit tape 22. Flexible printed circuit tape 22 widens along its length to smoothly connect these two areas.

FIG. 3 depicts a test contact fixture using flexible printed circuit tape 22 as a preferred embodiment of the present invention. This test contact fixture uses flexible printed circuit tape 22 mounted on rigid mounting plate 21 fabricated from a hardened steel material. Rigid mounting plate 21 has a plurality of channels 24 cut partway into its surface which serve as mounting places for flexible printed circuit tape 22. A pressure clamp 28 fastens one end of flexible printed circuit tape 22, and a second pressure clamp 35 fastens the opposite end. Pressure clamps 28 and 35 serve the dual purpose of mechanically attaching flexible printed circuit tape 22 firmly in place on rigid mounting plate 21 and of providing a low impedance electrical ground connection for those electrically conductive patterns 54 (FIG. 2) which must be electrically grounded. The ground connection is achieved by clamping solid conductive areas 53 (FIG. 2) onto rigid mounting plate 21 by pressure clamps 28 and 35. Channels 24 have a plurality of precision tape guide surfaces 23 along the sides, matching precision edges 55 (FIG. 2), which are positioned to ensure exact alignment of flexible printed circuit tape 22 in a lateral direction without requiring further adjustment. A plurality of lateral slots 26 are cut through rigid mounting plate 21 at the place where flexible printed circuit tape 22 makes electrical contact with conductive traces on tester board 29. Lateral slots 26 are used to allow a pressure clamp 31 to hold flexible printed circuit tape 22 in firm contact with tester board 29 thus ensuring good electrical contact between them. Pressure clamp 31 has a flexible pad 32 along its bottom edge so as to apply an even pressure to flexible printed circuit tape 22. In one preferred embodiment, flexible pad 32 is fabricated from a straightened section of rubber "O" ring.

Flexible printed circuit tape 22 is clamped to the top surface of rigid mounting plate 21 within notch 24 by pressure clamp 28. Flexible printed circuit tape 22 is then routed through a slot 25 in rigid mounting plate 21 to make electrical contact with tester board 29 positioned underneath rigid mounting plate 21. Flexible printed circuit tape 22 then passes around a tape former 27, passing over a contact surface 33 (FIG. 4) to the top side of rigid mounting plate 21 where the flexible tape is clamped into place by pressure clamp 35.

TAB leadframe 13 and protective carrier 12 holding integrated circuit 20 are held in contact with tape former 27 by spring loaded top plate 11. It is highly desirable to minimize the radius of flexible printed circuit tape 22 in the vicinity of the point at which contact is made to the leads of TAB leadframe 13, however a small bending radius will damage flexible printed circuit tape 22 by causing cracks or separation of electrically conductive patterns 54 from the underlying tape. If the useful life of flexible printed circuit tape 22 is to be maximized the shape of tape former 27 is highly critical. Tape former 27 is used to support and form flexible printed circuit tape 22 into a predetermined shape in the area where physical and electrical contact is made between TAB leadframe 13 and flexible printed circuit tape 22. The shape of tape former 27 is described in detail in FIG. 4 below.

FIG. 3 depicts four channels 24. In a preferred embodiment, each channel 24 has a flexible printed circuit tape 22. Each flexible printed circuit tape 22 is threaded through rigid mounting plate 21, clamped in place and shaped by tape former 27 as discussed above. A typical TAB leadframe 13 has leads extending from all four sides, and therefore a flexible printed circuit tape 22 is used to make contact with each of the four sides. TAB leadframes 13 having leads on other than four sides can easily be made and alternate embodiments having other than four channels 24 are made to match.

Figure 4:
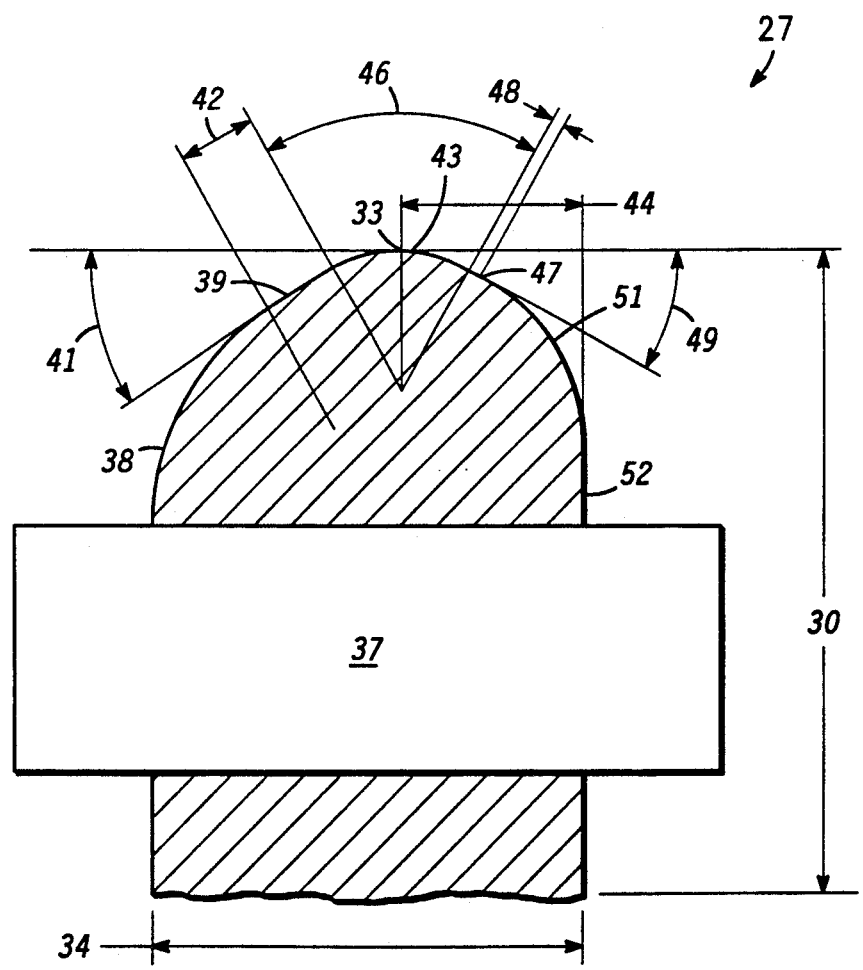
FIG. 4 depicts a magnified cross section of a portion of FIG. 3.

FIG. 4 depicts a magnified cross section of tape former 27, which is part of rigid mounting plate 21 depicted in FIG. 3. Tape former 27 has an inner surface 52 which is oriented facing the center of rigid mounting plate 21. Tape former 27 supports, tensions, and shapes the surface of flexible printed circuit tape 22 in the area of contact surface 33 into a specific compound shape comprising a combination of flat and curved surfaces. The shape of contact surface 33 is the point at which contact is made between the leads of TAB leadframe 13 and flexible printed circuit tape 22, and is at the highest point of tape former 27. In the preferred embodiment, tape former 27 is fabricated having an overall height 30 of 17.78 mm, as measured from the lowest surface of rigid mounting plate 21, and a width 34 of 2.54 mm. In the vicinity of the shaped top of tape former 27, one embodiment of this invention includes a locator pin 37 for the purpose of aligning and tensioning flexible printed circuit tape 22 by means of matching alignment holes 57 in flexible printed circuit tape 22. The top of tape former 27 is shaped with an arc shaped surface 38 having a radius of 15.875 mm. Arc shaped surface 38 smoothly meets a flat surface 39 having a width 42 of 0.43942 mm and forming an angle 41 of 30 degrees with contact surface 33. Flat surface 39 meets with an arc shaped surface 43 which passes through an angle 46 of 60 degrees, with a radius of 0.762 mm and having a center of rotation 44 which is 1.016 mm from inner surface 52. Arc shaped surface 43 meets a flat surface 47 which forms an angle 49 of 30 degrees with contact surface 33 and having a width 48 of 0.07366 mm. Flat surface 47 smoothly meets an arc shaped surface 51 having a radius of 1.143 mm. Arc shaped surface 51 continues the surface to smoothly meet inner flat surface 52.

Rigid mounting plate 21 provides an extremely firm support and can be fabricated to extremely precise dimensions allowing very precise alignment to be maintained between TAB leadframe 13 and flexible printed circuit tape 22 without requiring laborious adjustments by highly skilled personnel. In addition, the firm support provided by rigid mounting plate 21 helps to support tester board 29, preventing flexure and maintaining a highly planar configuration of this critical component. The path of flexible printed circuit tape 22 through rigid mounting plate 21 allows a high level of tension in flexible printed circuit tape 22 which, combined with the shape of tape former 27, further enhance the precision alignment between traces of flexible printed circuit tape 22 and leads of TAB leadframe 13. The method of clamping flexible printed circuit tape 22 at either end also provides a short signal path to an electrical ground provided by rigid mounting plate 21. A short signal path to an electrical ground is highly desirable since this minimizes undesired inductance for leads which are tied to ground and leads which require capacitive decoupling. This has the effect of lowering the impedance of the actual ground path and minimizing both electrical noise and crosstalk between signals in the test contact fixture.

Flexible printed circuit tape 22 (FIG. 3) is held tightly against rigid mounting plate 21 (FIG. 3) for the entire signal path, so well known stripline transmission line techniques are used when designing flexible printed circuit tape 22 to provide a constant 50 ohm impedance for each signal. The precision fabrication and rigid alignment of the fixture allows flexible printed circuit tape 22 to be optionally replaced or moved lengthwise when required to compensate for wear and damage at contact area 56 (FIG. 2) without requiring skilled or lengthy adjustment. The body of integrated circuit 20 (FIG. 3) is held clear of the test contact fixture allowing heat control devices (not shown) to be used to control the temperature of integrated circuit 20 (FIG. 3) during testing.

By now it should be apparent that use of a flexible printed circuit tape as a test contact fixture has many advantages over previous approaches, including an extremely high density of contacts combined with a constant impedance design. The fixture described in addition facilitates setup and alignment of the fixture as well as adjustment of flexible printed circuit tape 22 to compensate for wear. The test contact fixture of this invention is also suited to use of alignment pins to position TAB leadframe 13 in place on the fixture with a quick release type of clamp to facilitate rapid changing of integrated circuit parts for testing.

We claim:

1. A test contact fixture using flexible printed circuit tape, comprising:
    a rigid mounting plate used to support and align the test contact fixture;
    at least one flexible printed circuit tape which makes a plurality of electrical connections between an electrical device under test and a tester board and wherein the flexible printed circuit tape is fabricated to facilitate adjustment longitudinally so as to bring a fresh portion of the flexible printed circuit tape surface into contact with the leads of the electrical device under test;
    a tape former means to hold the flexible circuit tape in contact with the leads of the electrical device under test; and
    a plurality of pressure clamps to hold the flexible printed circuit tape in position on the rigid mounting plate.

2. The test contact fixture of claim 1 wherein the flexible printed circuit tape has at least one edge precisely cut to fit at least one matching precision tape guide surface on the rigid mounting plate so the flexible printed circuit tape is held in an exact lateral alignment without requiring further adjustment.

3. The test contact fixture of claim 1 wherein the flexible printed circuit tape is aligned by means of locator pins and matching holes in the flexible printed circuit tape.

4. The test contact fixture of claim 3 wherein the matching holes are elongated into slots so as to allow the flexible printed circuit tape to be adjusted longitudinally at least once so as to bring the fresh portion of the surface into contact with the electrical device being tested.

5. The test contact fixture of claim 3 wherein the matching holes are replicated longitudinally so as to allow the flexible printed circuit tape to be adjusted longitudinally to bring the fresh portion of the surface into contact with the electrical device being tested.

6. The test contact fixture of claim 1 wherein the tape former means is fabricated having a continuous surface which is made up of a plurality of arc segments and flat areas smoothly blending into one another.

7. The test contact fixture of claim 5 wherein the tape former means is fabricated having a smooth surface which passes through a bend of 180 degrees and which is made up of a first arc, a first flat surface, a second arc, a second flat surface, and a third arc.

8. The test contact fixture of claim 1 wherein the rigid mounting plate, the plurality of pressure clamps, and the tape former means are machined from a hardened steel material.

9. The test contact fixture of claim 1 wherein the flexible printed circuit tape is clamped on the top surface of the rigid mounting plate, routed through a slot in the rigid mounting plate to make electrical contact with a printed circuit board positioned underneath the rigid mounting plate, routed around the tape former means to the top side of the rigid mounting plate where the flexible tape is clamped a second time.

10. A test contact fixture using flexible printed circuit tape, comprising:
    a rigid mounting plate which supports the test contact fixture and holds all components in a predetermined position;

at least one flexible printed circuit tape having at least one precision edge to fit at least one matching precision tape guide surface on the rigid mounting plate so the flexible printed circuit tape is held in an exact lateral alignment without requiring further adjustment;

a tape former means to hold the flexible circuit tape in contact with the pins of an integrated circuit being tested having a continuous surface which follows a curve made up of a plurality of arc segments and flat areas smoothly blending into one another; and a plurality of pressure clamps to hold the flexible printed circuit tape in position on the rigid mounting plate and hold the flexible printed circuit tape in a fixed position, under tension, so as to ensure intimate contact between the rigid mounting plate and the flexible printed circuit tape throughout the entire active portion of the flexible printed circuit tape.

11. A test contact fixture using flexible printed circuit tape, comprising:

a hardened steel plate which supports the test contact fixture and holds all components precisely in correct alignment;

at least one flexible printed circuit tape having at least one matching precision edge cut to fit at least one channel on the hardened steel plate so the flexible printed circuit tape is held in an exact lateral alignment without requiring further adjustment and wherein the hardened steel plate forms a ground plane thereby forming a transmission line with the flexible printed circuit tape;

a composite tip to hold the flexible circuit tape in intimate contact with pins of an integrated circuit being tested, comprising a compound shape with a combination of curved surfaces and flat surfaces which protrude above the hardened steel plate; and a plurality of pressure clamps used to hold the flexible printed circuit tape in position on the hardened steel plate, yet allowing a longitudinal adjustment.

12. A method of testing an integrated circuit comprising:

providing a rigid mounting plate to support and align a test contact fixture;

providing at least one flexible circuit tape which makes a plurality of electrical connections between an electrical device and a tester board with no intervening contacting means;

threading the flexible circuit tape through slots in the rigid mounting plate and over a tape former to form a contact area wherein the tape former forces the flexible circuit tape into contact with pins of an integrated circuit;

holding the flexible printed circuit tape in position on the rigid mounting plate by a plurality of pressure clamps; and bringing the integrated circuit into contact with the contact area.

* * * * *